United States Patent
Choi et al.

(10) Patent No.: US 7,990,734 B2
(45) Date of Patent: Aug. 2, 2011

(54) SEMICONDUCTOR MEMORY MODULE WITH REVERSE MOUNTED CHIP RESISTOR

(75) Inventors: Hyun-Seok Choi, Chungcheongnam-do (KR); Hyung-Mo Hwang, Chungcheongnam-do (KR); Yong-Hyun Kim, Gyeonggi-do (KR); Hyo-Jae Bang, Chungcheongnam-do (KR); Su-Yong An, Chungcheongnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 915 days.

(21) Appl. No.: 11/934,616

(22) Filed: Nov. 2, 2007

(65) Prior Publication Data

US 2008/0106876 A1 May 8, 2008

(30) Foreign Application Priority Data

Nov. 6, 2006 (KR) .............................. 2006-0109070

(51) Int. Cl.
*H05K 7/10* (2006.01)
*H05K 7/12* (2006.01)

(52) U.S. Cl. .................... 361/767; 361/782; 361/784

(58) Field of Classification Search .......... 361/782–784, 361/767; 174/257–260
See application file for complete search history.

(56) References Cited

U.S. PATENT DOCUMENTS 7,180,007 B2 * 2/2007 Nishikawa et al. ........... 174/257
7,468,294 B2 * 12/2008 Yamaura et al. .............. 438/124

FOREIGN PATENT DOCUMENTS

| JP | 05-152101 | 6/1993 |
| JP | 2002-231502 | 8/2002 |
| JP | 2003-282303 | 10/2003 |

OTHER PUBLICATIONS

English language abstract of Japanese Publication No. 05-152101.
English language abstract of Japanese Publication No. 2002-231502.
English language abstract of Japanese Publication No. 2003-282303.

* cited by examiner

*Primary Examiner* — Tuan T Dinh
(74) *Attorney, Agent, or Firm* — Muir Patent Consulting, PLLC

(57) ABSTRACT

A semiconductor memory module having a reverse mounted chip resistor, and a method of fabricating the same are provided. By reverse mounting the chip resistor on the semiconductor memory module, the resistive material is protected, thereby preventing open circuits caused by damage to the resistive material. Also, a chip-resistor connection pad of a module substrate is formed to extend higher from the module substrate than other connection pads connected to other elements. Thus, the resistive material of the chip resistor does not contact the module substrate, thereby preventing poor alignment and defective connections.

20 Claims, 5 Drawing Sheets

SEMICONDUCTOR MEMORY MODULE WITH REVERSE MOUNTED CHIP RESISTOR

CROSS-REFERENCE TO RELATED PATENT APPLICATION

This application claims the benefit of Korean Patent Application No. 10-2006-0109070, filed on Nov. 6, 2006, in the Korean Intellectual Property Office, the disclosure of which is incorporated herein in its entirety by reference.

BACKGROUND

1. Field of the Invention

The present invention relates to a semiconductor memory module, and more particularly to a semiconductor memory module with a reverse mounted chip resistor, and a method of fabricating the same.

2. Description of the Related Art

Semiconductor memory modules include not only semiconductor memory chips, but also passive devices such as capacitors and resistors, which are all generally mounted on a module substrate. Generally, the resistor of a memory module is mounted in the form of a chip resistor beside an external connection port of a module substrate. The chip resistor helps control the current within the circuit and typically drops the voltage.

FIG. 1 illustrates the structure of a typical chip resistor. The chip resistor includes a thin-film resistive material 2, such as TaN or $RuO_2$, on an insulating substrate 1 composed of a material such as alumina. A thin-film internal electrode 3 contacts both ends of the resistive material 2 and a plated electrode 4 is formed on the internal electrode 3. A protection layer 5, such as a glass layer, is formed over the resistive material 2 to protect the resistive material 2.

Because of substantially similar ends of the chip resistor, which are used when mounting the chip resistor to the module substrate, the chip resistor may be mounted with either the surface with the resistive material facing upward, or the surface with the protective layer 5.

However, when the resistive material faces upward the resistive material is exposed and both the resistive material and the electrode are susceptible to physical damage during assembly or handling by a user. Accordingly, the electrode can peel off or the resistive material can break, causing an open circuit. Moreover, when a mounting facility grips the chip resistor with a vacuum nozzle to place the chip resistor onto the module substrate, the vacuum nozzle must grip the uneven surface of the resistive material and the protection layer, which can cause pickup errors and misalignment.

These problems may be partially solved when the resistive material faces downward during mounting. However, even in this case, the chip resistor may be slanted because the resistive material and protection layer are higher than the plated electrodes.

SUMMARY

Embodiments of the present invention provide a reliable semiconductor memory module that prevents open circuits due to damage to a resistive material within a chip resistor and a defective connection caused by slanting of the chip resistor.

Embodiments of the present invention also provide a method of fabricating a reliable semiconductor memory module that prevents open circuits due to damage to a resistive material within a chip resistor and a defective connection caused by slanting of the chip resistor. According to an embodiment of the present invention, a semiconductor memory module includes a module substrate having a chip-resistor pad and a chip resistor reverse mounted onto the chip-resistor connection pad of the module substrate. The chip resistor includes an insulating substrate, a resistive material portion on the insulating substrate, and a metal electrode electrically connected to the resistor material portion and located on the insulating substrate. The chip-resistor connection pad is higher than other connection pads of the module substrate, to prevent the resistive material portion of the chip resistor from contacting the module substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
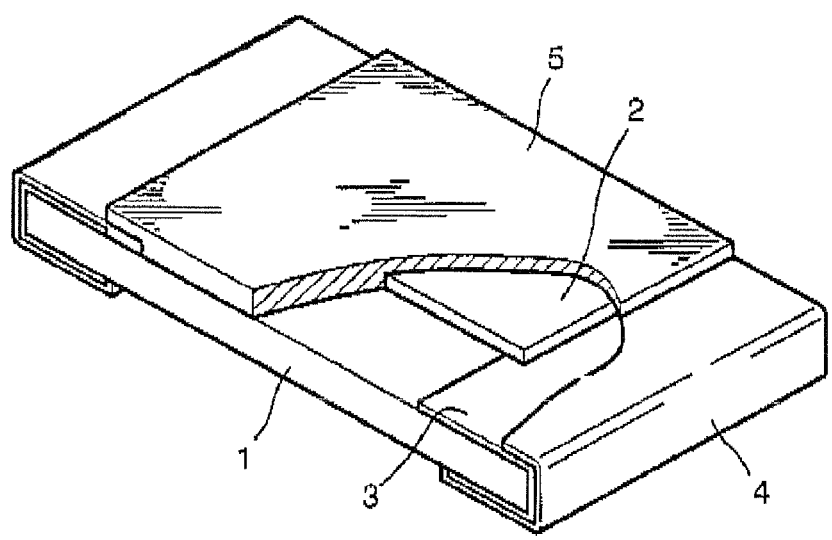
FIG. 1 is an exploded perspective view of a typical chip resistor.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 2:
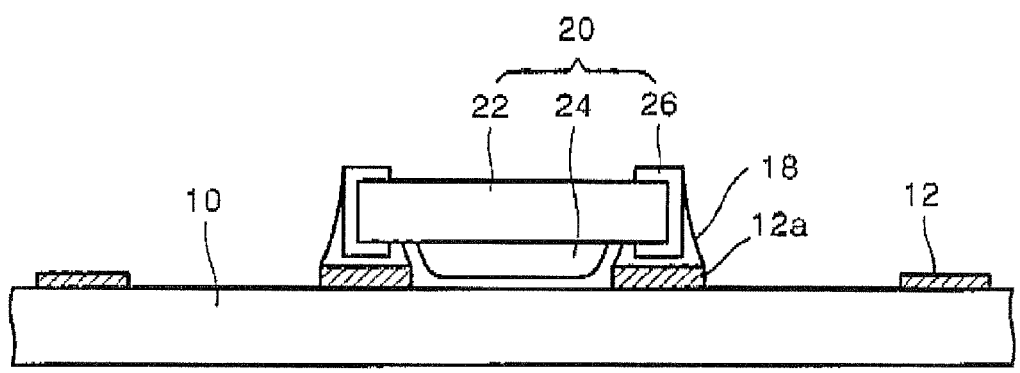
FIG. 2 is a sectional view of a semiconductor memory module according to an embodiment of the present invention.

FIG. 2 is a sectional view of a semiconductor memory module according to an embodiment of the present invention. Referring to FIG. 2, the semiconductor memory module includes a chip resistor 20 that is reverse mounted on a module substrate 10 such that a thin film resistor material 24 of the chip resistor 20 faces the module substrate 10. The chip resistor 20 may be mounted on at least one chip-resistor pad 12a, which is formed on the module substrate 10 using a solder paste 18. The chip resistor 20 includes the thin-film resistor material 24 on an insulating substrate 22, and further includes a metal electrode 26 electrically connected to the resistive material 24 and formed on each side of the insulating substrate 22. Although, the metal electrode 26 is shown to extend to the rear of the chip resistor 20 in FIG. 2, it may reach just to the side of the chip resistor 20. The metal electrode 26 may have an internal electrode covered by a plated layer. Also, a polymer protection layer (not shown) may be formed to protect the surface of the chip resistor 20 that is opposite to that on which the resistive material 24 is formed. The resistive material 24 of FIG. 2 includes a protection layer (not shown), where the protective layer extends further from the insulating substrate 22 than the metal electrode 26 connected to the chip-resistor control pad 12a. According to this configuration of the present embodiment, the chip-resistor connection pad 12a of the module substrate 10 may be formed to extend further above the module substrate 10 than other connection pads 12 to prevent the resistive material 24 of the chip resistor 20 from contacting the module substrate 10 and slanting of the chip resistor 20.

Figure 3:
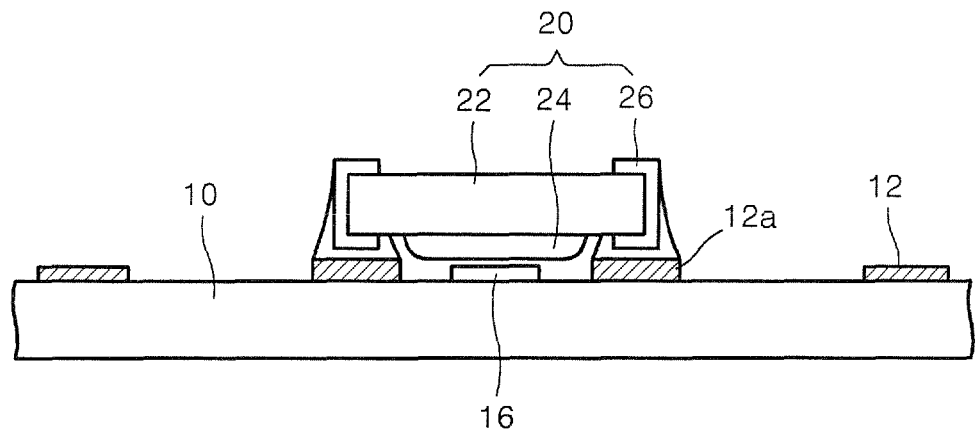
FIG. 3 is a sectional view of a semiconductor memory module according to another embodiment of the present invention.

FIG. 3 is a sectional view of a semiconductor memory module according to another embodiment of the present invention. The semiconductor memory module according to the embodiment shown in FIG. 3 is substantially similar in construction to the semiconductor memory module illustrated in FIG. 2. However, the semiconductor memory module illustrated in FIG. 3 further includes an insulating dam 16 to prevent a short between the chip-resistor connection pads 12a. The chip-resistor connection pad 12a may again extend further from the surface of the module substrate 10 than other connection pads 12 in order to prevent the resistive material 24 of the chip resistor 20 from contacting the insulating dam 16.

FIGS. 4A through 4F are sectional views sequentially illustrating a method of fabricating a semiconductor memory module according to an embodiment of the present invention.

Figure 4A:
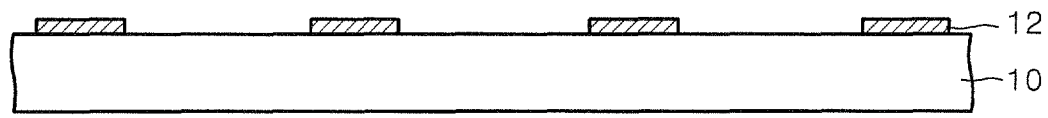
FIGS. 4A through 4F are sectional views sequentially illustrating a method of fabricating a semiconductor memory module according an embodiment of the present invention.

Referring to FIG. 4A, connection pads 12 are patterned on a module substrate 10. The module substrate 10 may include a copper clad laminate (CCL) having thin copper layers on both sides of an epoxy plate. The connection pads 12 may be connected to various elements including a chip resistor, and may be formed by patterning the outermost thin copper layer of the CCL by photolithography.

Figure 4B:
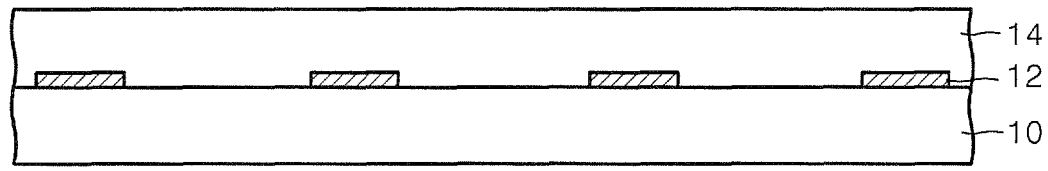
Figure 4C:
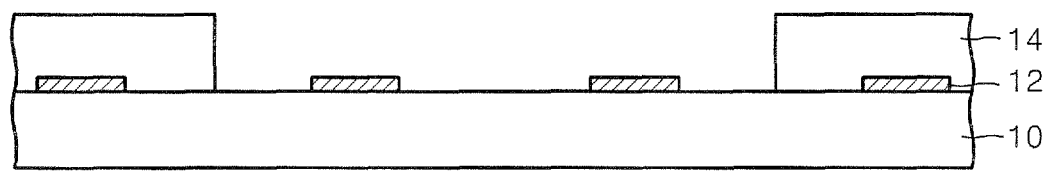

Referring to FIGS. 4B and 4C, a photoresist 14 is coated on the module substrate 10 to cover the connection pads. The photoresist 14 may then be patterned to expose one or more connection pads 12 that are configured to be connected to a chip resistor.

Figure 4D:
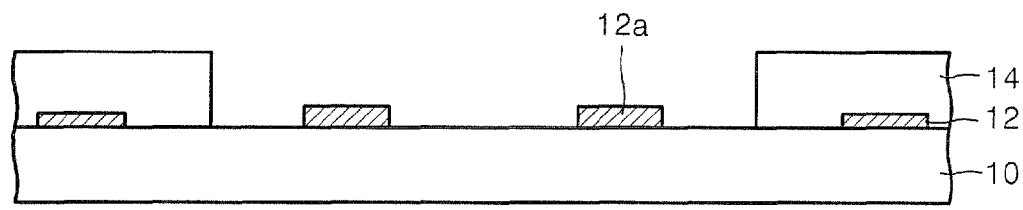

Referring to FIG. 4D, a copper (Cu) layer is added onto the one or more connection pads 12 exposed by the photoresist 14, thereby forming a chip-resistor connection pad 12a that may extend further from the surface of the module substrate 10 than the other connection pads 12 that are shielded by the photoresist 14. The copper layer may be formed by electroplating, for example, and the chip-resistor connection pad 12a may have a thickness of about 70 to about 80 mm depending on the height of the resistive material of the chip resistor 20.

Figure 4E:
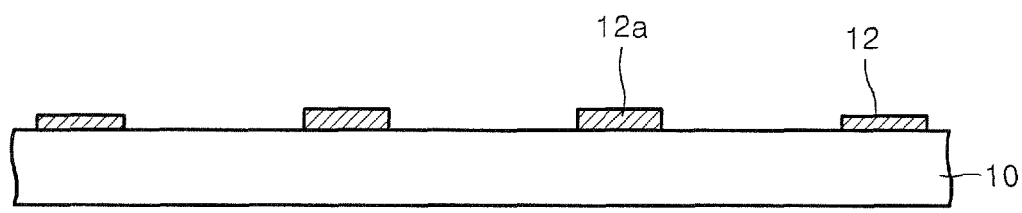

Referring to FIG. 4E, after forming the chip-resistor connection pad 12a by copper plating, the photoresist pattern 14 is removed. As illustrated in FIG. 4D, the chip-resistor connection pad 12a extends higher above the surface of the module substrate 10 than the other connection pads 12.

Figure 4F:
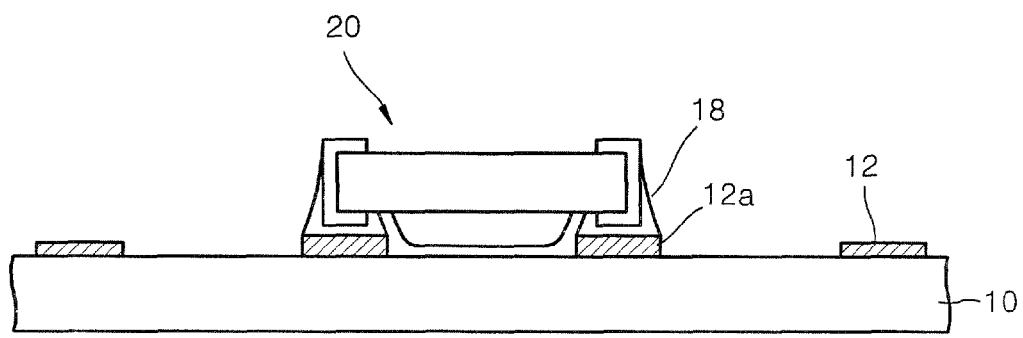

Referring to FIG. 4F, the chip resistor 20 is then reverse mounted onto the one or more chip-resistor connection pads 12a. To accomplish this mounting process, the solder paste 18 may be printed onto the chip-resistor connection pad 12a. The chip resistor 20 is then aligned with the one or more chip-resistor connection pads 12a and disposed thereon. The module substrate 11 holding the chip resistor 20 may then be thermally treated to melt the paste 18 and secure the chip resistor 20 onto the chip-resistor connection pad 12a (i.e., solder the chip resistor 20 onto the chip-resistor connection pad 12a). Since the chip-resistor connection pad 12a is high enough to prevent the resistive material from contacting the module substrate 10, the problem of having the chip resistor slanted can be prevented.

Although not shown in FIGS. 4A-4F, the insulating dam 16 illustrated in FIG. 3 may be formed on the module substrate 10 to prevent a short between the chip-resistor connection pads 12a after removing the photoresist 14 and before mounting the chip resistor 20. Additionally, the height of the chip-resistor connection pad 12a can be adjusted to insure that the resistive material 24 of the chip resistor 20 does not contact the insulating dam 16.

FIGS. 5A through 5F are sectional views sequentially illustrating a method of fabricating a semiconductor memory module according to another embodiment of the present invention.

Figure 5A:
FIGS. 5A through 5F are sectional views sequentially illustrating a method of fabricating a semiconductor memory module according to another embodiment of the present invention.

Referring to FIG. 5A, the outermost thin copper layer of a CCL layer of a module substrate 10 is patterned to form connection pads 12 similar to those in the embodiment illustrated in FIG. 4A. Here, the outermost thin copper layer of the CCL layer of the module substrate 10 may have a thickness of about 70 to about 80 µm.

Figure 5B:
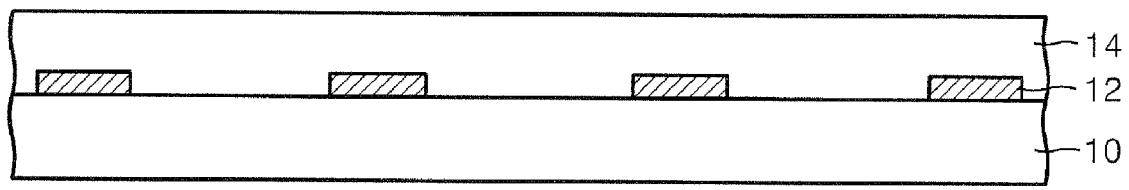
Figure 5C:
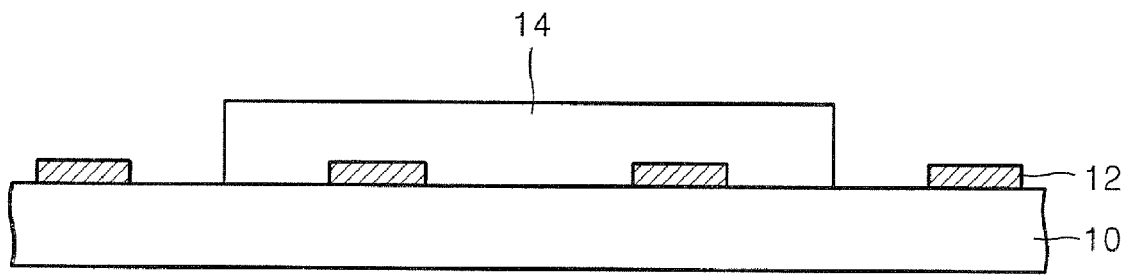

Referring to FIGS. 5B and 5C, a photoresist 14 is formed on the module substrate 10 to cover the connection pads 12. Then, the photoresist 14 is patterned to cover only the connection pads 12 corresponding to where a chip resistor will be connected.

Figure 5D:
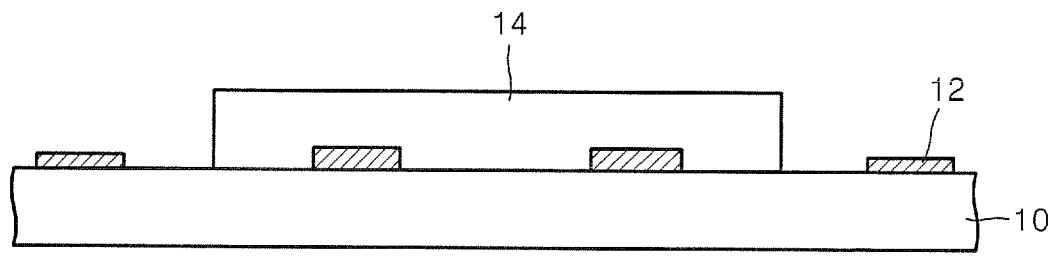

Referring to FIG. 5D, the connection pads 12 exposed by the photoresist 14 are etched to decrease their height. The connection pads 12 may be wet etched using a mixed solution of a fluorine-based compound, for example. The connection pads 12 that remain covered by the photoresist 14 are not etched during this process and become chip-resistor connection pads 12a that can extend above the surface of the module substrate 10 more than the remaining etched connection pads 12.

Figure 5E:
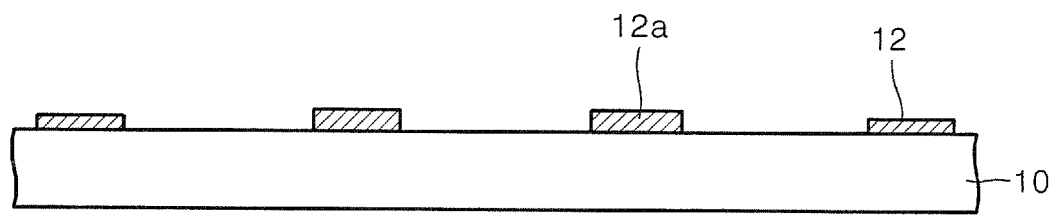

Referring to FIG. 5E, after etching the connection pads 12, the photoresist pattern 14 is removed. As illustrated in FIG. 5E, the chip-resistor connection pads 12a extend higher above the surface of the module substrate 10 than the other connection pads 12.

Figure 5F:
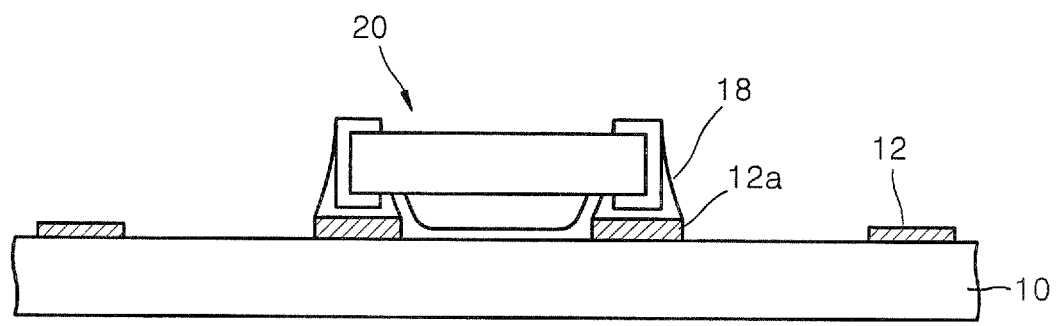

Referring to FIG. 5F, a chip resistor 20 is reverse mounted onto the chip-resistor connection pad 12a of the substrate module in a substantially similar process that is described above with reference to FIG. 4F.

In experiments, the chip resistors mounted according to embodiments of the present invention displayed positive results with very few or substantially no defects of external appearance, passed an electrical test, and did not fail heat cycling (about −25 to about 125° C.).

According to some embodiments of the present invention, a chip resistor is reverse mounted onto a module substrate to protect and prevent damage to the resistive material and avoid open circuits. Furthermore, connection pads connected to the chip resistor are formed to extend higher from the module substrate than other connection pads to prevent a defective connection of the chip resistor that could occur if the resistive material of the chip resistor were to contact the module substrate or the insulating dam.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:
1. A semiconductor memory module comprising:
   a module substrate;
   a plurality of connection pads formed on the module substrate;
   at least one chip-resistor connection pad formed on the module substrate, the at least one chip-resistor pad extending higher above the module substrate than the plurality of connection pads; and a chip resistor including an insulating substrate, a resistive material portion formed on the insulating substrate, and a metal electrode electrically connected to the resistive material portion and formed on the insulating substrate, the chip resistor reverse mounted onto the at least one chip-resistor connection pad to orient the resistive material portion of the chip resistor toward the module substrate such that the resistive material portion of the chip resistor is located between the insulating substrate and the module substrate.

2. The semiconductor memory module of claim 1, wherein the at least one chip-resistor connection pad includes a plurality of chip-resistor connection pads, the semiconductor memory module further comprising an insulating dam formed on the module substrate to prevent a short between the chip-resistor connection pads.

3. The semiconductor memory module of claim 1, wherein the resistive material portion of the chip resistor comprises a thin film resistive material on the insulating substrate, and a protection layer on the thin film resistive material.

4. The semiconductor memory module of claim 1, wherein the metal electrode comprises an internal electrode and a plated layer on the internal electrode.

5. The semiconductor memory module of claim 1, wherein the metal electrode extends from the surface on which the resistive material portion of the insulating substrate is formed to a side of the insulating substrate.

6. The semiconductor memory module of claim 1, further comprising a polymer protection layer on the surface of the chip resistor opposite to that on which the resistive material is formed.

7. The semiconductor memory module of claim 4, wherein the plated layer is thick enough to prevent the resistive material portion of the chip resistor from contacting the module substrate.

8. A semiconductor memory module comprising:
a module substrate;
a plurality of connection pads formed on the module substrate;
first and second chip-resistor connection pads formed on the module substrate, the first and second chip-resistor connection pads extending higher above the module substrate than the plurality of connection pads; and
a chip resistor reverse mounted between the first chip-resistor connection pad and the second chip-resistor connection pad, the chip resistor including an insulating substrate, a resistive material portion formed on the insulating substrate, and a first and second metal electrode electrically connected to the first and second chip-resistor connection pads respectively,
wherein the chip resistor is mounted onto the first and second chip-resistor connection pads such that the resistive material portion of the chip resistor is located between the insulating substrate and the module substrate.

9. The semiconductor memory module of claim 8, further comprising an insulating dam formed on the module substrate to prevent a short between the first and second chip-resistor connection pads.

10. The semiconductor memory module of claim 8, wherein the resistive material portion of the chip resistor comprises a thin film resistive material, and a protection layer on the thin film resistive material.

11. The semiconductor memory module of claim 8, wherein each of the first and second metal electrodes comprises an internal electrode and a plated layer on the internal electrode.

12. The semiconductor memory module of claim 8, wherein each of the first and second metal electrodes extends from the surface on which the resistive material portion on the insulating substrate is formed to a side of the insulating substrate.

13. The semiconductor memory module of claim 8, further comprising a polymer protection layer on the surface of the chip resistor opposite to that on which the resistive material portion is formed.

14. The semiconductor memory module of claim 11, wherein the plated layer is thick enough to prevent the resistive material portion of the chip resistor from contacting the module substrate.

15. A semiconductor memory module comprising:
a module substrate;
a plurality of connection pads formed on the module substrate;
a first chip-resistor connection pad and a second chip-resistor connection pad formed on the module substrate; and
a chip resistor including an insulating substrate, a resistive material formed on the insulating substrate, and a first metal electrode and a second metal electrode formed on the insulating substrate,
wherein the first metal electrode and second metal electrode are mounted on respective first chip-resistor connection pad and second chip-resistor connection pad,
the chip resistor is reverse mounted on the module substrate such that the resistive material of the chip resistor is located between the insulating substrate and the module substrate, and
the combined first and second chip-resistor connection pads and first and second metal electrodes are thick enough to prevent the resistive material from contacting the module substrate.

16. The semiconductor memory module of claim 15, further comprising an insulating dam formed on the module substrate to prevent a short between the first and second chip-resistor connection pads.

17. The semiconductor memory module of claim 15, wherein the resistive material is part of a resistive material portion of the chip resistor, the resistive material portion further including a protection layer on the resistive material.

18. The semiconductor memory module of claim 15, wherein each of the first and second metal electrodes extends from the surface on which the resistive material on the insulating substrate is formed to a side of the insulating substrate.

19. The semiconductor memory module of claim 15, further comprising a polymer protection layer on the surface of the chip resistor opposite to that on which the resistive material is formed.

20. The semiconductor memory module of claim 18, wherein each of the first and second metal electrodes further extends to contact a surface of the insulating substrate opposite the surface on which the resistive material is formed.

* * * * *